(12) United States Patent
Lee et al.

(10) Patent No.: US 11,289,436 B2
(45) Date of Patent: Mar. 29, 2022

(54) SEMICONDUCTOR PACKAGE HAVING A LASER-ACTIVATABLE MOLD COMPOUND

(71) Applicant: Infineon Technologies Austria AG, Villach (AT)

(72) Inventors: Chee Hong Lee, Melaka (MY); Kok Yau Chua, Melaka (MY); Chii Shang Hong, Melaka (MY); Swee Kah Lee, Melaka (MY); Chee Yang Ng, Johor (MY); Klaus Schiess, Allensbach (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/886,305

(22) Filed: May 28, 2020

(65) Prior Publication Data

US 2020/0381380 A1 Dec. 3, 2020

(30) Foreign Application Priority Data

May 31, 2019 (EP) .................................. 19177680
Jun. 21, 2019 (EP) .................................. 19181649

(51) Int. Cl.
*H01L 23/31* (2006.01)
*H01L 21/56* (2006.01)
*H01L 23/00* (2006.01)

(52) U.S. Cl.
CPC ............ *H01L 24/05* (2013.01); *H01L 21/565* (2013.01); *H01L 23/3114* (2013.01);
(Continued)

(58) Field of Classification Search
CPC ...................................................... H01L 24/05
See application file for complete search history.

(56) References Cited

U.S. PATENT DOCUMENTS 5,437,915 A   8/1995   Nishimura et al.
5,554,886 A   9/1996   Song
(Continued)

FOREIGN PATENT DOCUMENTS

CN   101930958 A   12/2010
EP   1775767 A2    4/2007
(Continued)

OTHER PUBLICATIONS

Saw, Khay Chwan, et al., "Chip to Chip Interconnect in Encapsulant of Molded Semiconductor Package", U.S. Appl. No. 16/375,479, filed Apr. 4, 2019, pp. 1-27.
(Continued)

*Primary Examiner* — William A Harriston
(74) *Attorney, Agent, or Firm* — Murphy, Bilak & Homiller, PLLC

(57) ABSTRACT

Embodiments of molded packages and corresponding methods of manufacture are provided. In an embodiment of a molded package, the molded package includes a laser-activatable mold compound having a plurality of laser-activated regions which are plated with an electrically conductive material to form metal pads and/or metal traces at a first side of the laser-activatable mold compound. A semiconductor die embedded in the laser-activatable mold compound has a plurality of die pads. An interconnect electrically connects the plurality of die pads of the semiconductor die to the metal pads and/or metal traces at the first side of the laser-activatable mold compound.

13 Claims, 17 Drawing Sheets

(52) U.S. Cl.
CPC .............. *H01L 24/03* (2013.01); *H01L 24/11* (2013.01); *H01L 24/13* (2013.01); *H01L 24/43* (2013.01); *H01L 24/45* (2013.01); *H01L 2224/031* (2013.01); *H01L 2224/0331* (2013.01)

(56) References Cited

U.S. PATENT DOCUMENTS

| | | | |
|---|---|---|---|
| 5,602,420 | A | 2/1997 | Ogata et al. |
| 5,656,856 | A | 8/1997 | Kweon |
| 5,729,433 | A | 3/1998 | Mok |
| 5,835,988 | A | 11/1998 | Ishii |
| 6,169,323 | B1 | 1/2001 | Sakamoto |
| 6,424,031 | B1 | 7/2002 | Glenn |
| 6,479,322 | B2 | 11/2002 | Kawata et al. |
| 6,534,876 | B1 | 3/2003 | Glenn |
| 7,633,765 | B1 | 12/2009 | Scanlan et al. |
| 7,944,034 | B2 | 5/2011 | Gerber et al. |
| 8,026,589 | B1 | 9/2011 | Kim et al. |
| 8,759,956 | B2 | 6/2014 | Soller |
| 9,224,688 | B2 | 12/2015 | Chuang et al. |
| 9,230,883 | B1 | 1/2016 | Hiner et al. |
| 9,559,064 | B2 | 1/2017 | Chen et al. |
| 9,564,409 | B2 | 2/2017 | Seddon et al. |
| 10,217,728 | B2 | 2/2019 | Appelt et al. |
| 10,264,664 | B1 | 4/2019 | Vinciarelli et al. |
| 2004/0061213 | A1 | 4/2004 | Karnezos |
| 2004/0227251 | A1 | 11/2004 | Yamaguchi |
| 2005/0067680 | A1 | 3/2005 | Boon et al. |
| 2005/0167814 | A1 | 8/2005 | Beroz et al. |
| 2007/0080437 | A1 | 4/2007 | Marimuthu et al. |
| 2007/0257340 | A1 | 11/2007 | Briggs et al. |
| 2008/0272464 | A1 | 11/2008 | Do et al. |
| 2008/0272477 | A1 | 11/2008 | Do et al. |
| 2009/0206458 | A1 | 8/2009 | Andrews et al. |
| 2009/0230487 | A1 | 9/2009 | Saitoh et al. |
| 2009/0321956 | A1 | 12/2009 | Sasaki et al. |
| 2010/0044808 | A1 | 2/2010 | Dekker et al. |
| 2010/0096737 | A1 | 4/2010 | Chua |
| 2010/0207257 | A1 | 8/2010 | Lee |
| 2011/0095417 | A1* | 4/2011 | Gomez ................. H01L 21/561 257/737 |
| 2011/0221005 | A1 | 9/2011 | Luo et al. |
| 2012/0108013 | A1 | 5/2012 | Fujisawa et al. |
| 2012/0217643 | A1 | 8/2012 | Pagaila et al. |
| 2012/0217644 | A1 | 8/2012 | Pagaila |
| 2013/0050227 | A1 | 2/2013 | Petersen et al. |
| 2013/0280826 | A1 | 10/2013 | Scanlan et al. |
| 2014/0332942 | A1 | 11/2014 | Kanemoto |
| 2015/0279778 | A1* | 10/2015 | Camacho .......... H01L 21/76877 257/737 |
| 2015/0380384 | A1 | 12/2015 | Williams et al. |
| 2016/0005675 | A1 | 1/2016 | Tong |
| 2016/0155728 | A1 | 6/2016 | Zhao et al. |
| 2017/0092567 | A1 | 3/2017 | Vincent et al. |
| 2017/0125355 | A1 | 5/2017 | Su et al. |
| 2017/0256472 | A1 | 9/2017 | Chan et al. |
| 2017/0256509 | A1 | 9/2017 | Lee et al. |
| 2017/0317015 | A1 | 11/2017 | Lee et al. |
| 2018/0124922 | A1 | 5/2018 | Ji et al. |
| 2018/0211946 | A1 | 7/2018 | Shiu |
| 2018/0342434 | A1 | 11/2018 | Ziglioli |
| 2018/0358292 | A1 | 12/2018 | Kong et al. |
| 2019/0115287 | A1 | 4/2019 | Derai et al. |
| 2019/0157173 | A1 | 5/2019 | Danny Koh et al. |
| 2019/0259629 | A1 | 8/2019 | Ziglioli |
| 2020/0185293 | A1 | 6/2020 | Schmalzl et al. |
| 2020/0203264 | A1 | 6/2020 | Ziglioli |

FOREIGN PATENT DOCUMENTS

| | | |
|---|---|---|
| KR | 20120056624 A | 6/2012 |
| WO | 2010080068 A1 | 7/2010 |

OTHER PUBLICATIONS

"Dual Exposed Pad PKG", Amkor Technology, 2010, pp. 1-4.
"EpoxyClay Steel", Pioneer Adhesives, Inc., Accessed online at http://www.pioneer-adhesives.com/product/epoxyclay-steel on Dec. 11, 2018, pp. 1-2.
"Laser-Direct-Structuring (LDS) of 3D-MIDs", LPKF Laser & Electronics AG, https://www.youtube.com/watch?v=VLL9NEA-9PI, Jun. 14, 2010.
"MicroLeadFrame® (MLF | QFN | VQFN | LFCSP | DFN | LPCC)", Amkor Technology, https://www.amkor.com/go/qfn, accessed Aug. 10, 2017, pp. 1-3.
"Polymer Clay FAQ", Polymer Clay Web, 2011, Accessed online at http://www.polymerclayweb.com/faq.aspx on Dec. 7, 2018, pp. 1-5.
"SO8-FL (Flat Lead) Power Discrete", Amkor Technology, https://www.amkor.com/go/packaging/allpackages/so8/so8flflatleadpowerdiscrete, accessed Aug. 10, 2017, pp. 1-2.
"This is Mouldable Glue", Sugru, Accessed online at https://sugru.com/about on Dec. 7, 2018, pp. 1-9.
"TSON8-FL (Flat Lead) Power Discrete", Amkor Technology, https://www.amkor.com/go/packaging/all-packages/tson8/tson8-fl-flat-lead-power-discrete, accessed Nov. 16, 2017, pp. 1-2.

* cited by examiner

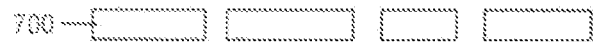
Fig. 9A                                Fig. 10A
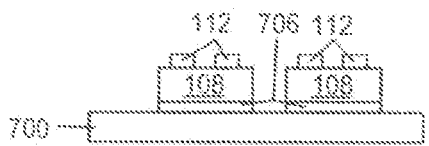
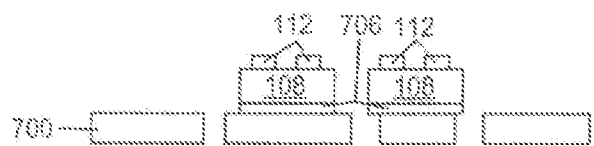
Fig. 9B                                Fig. 10B
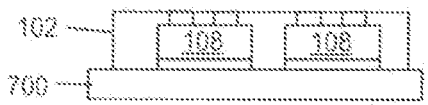
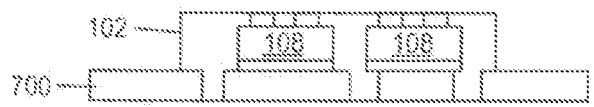
Fig. 9C                                Fig. 10C
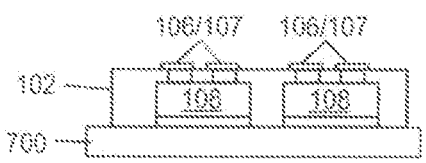
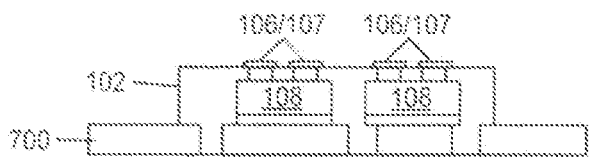
Fig. 9D                                Fig. 10D
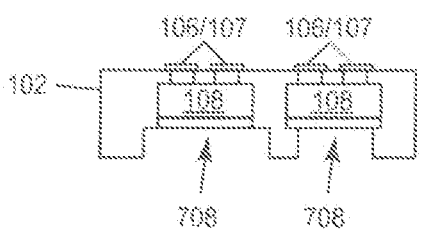
Fig. 9E                                Fig. 10E

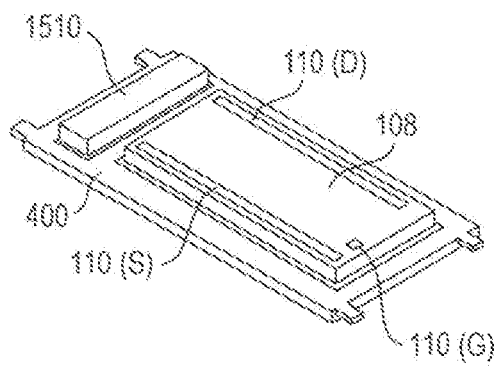
Fig. 15A
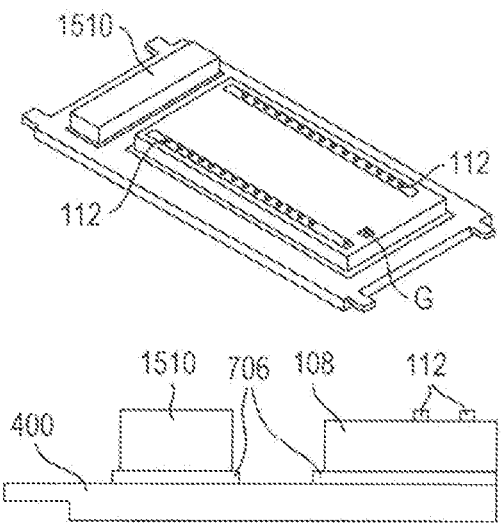
Fig. 15B
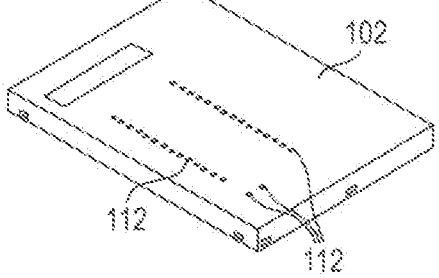
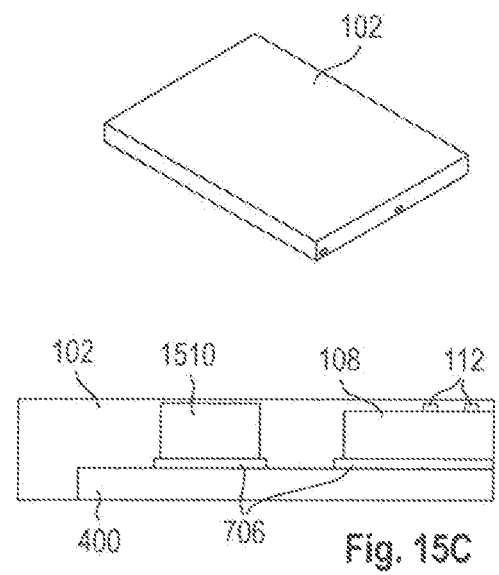
Fig. 15C
Fig. 15D

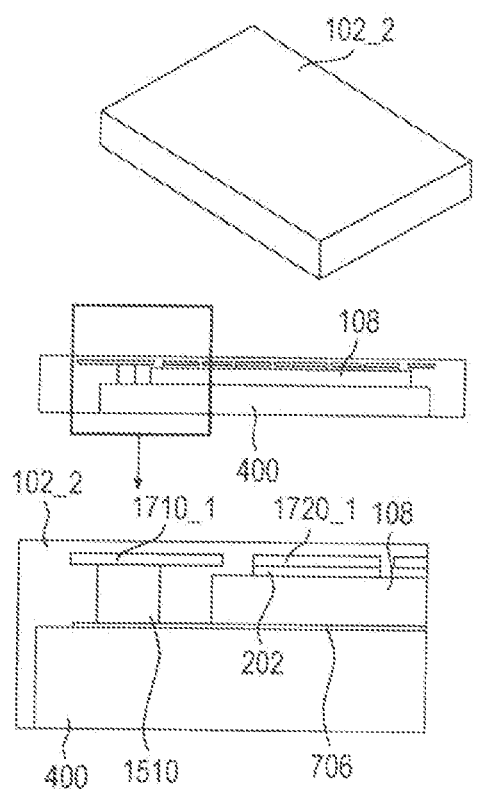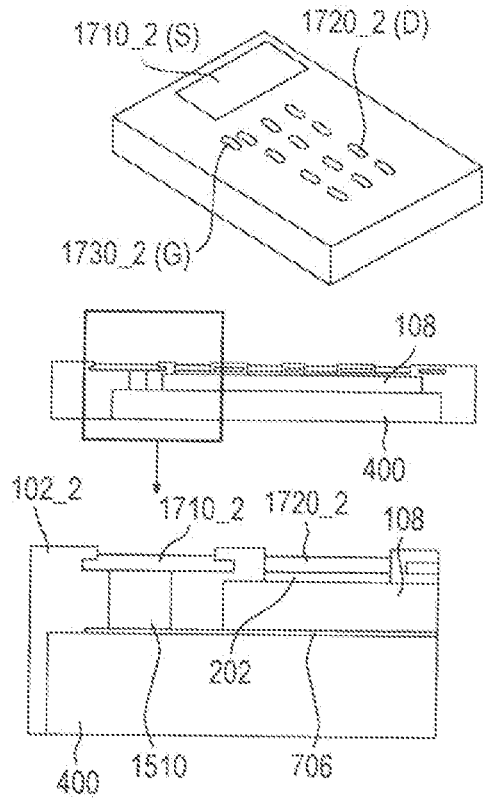
Fig. 17E
Fig. 17F
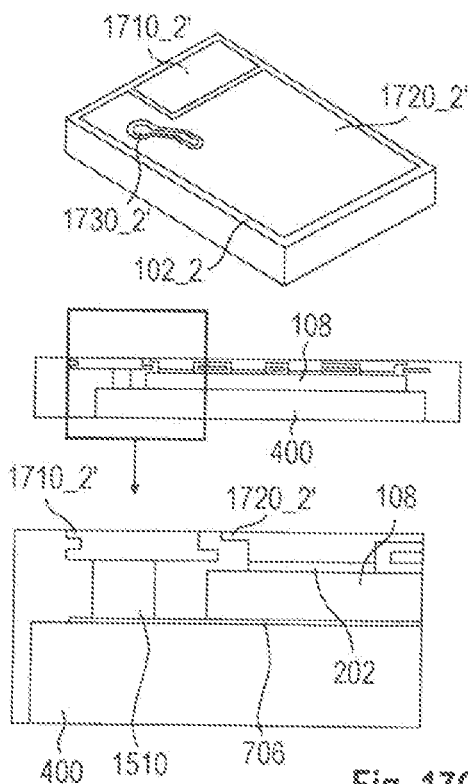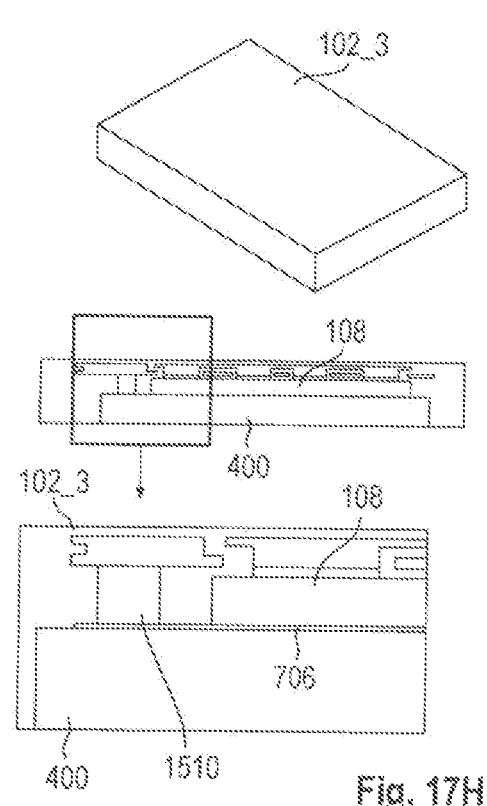
Fig. 17G
Fig. 17H

SEMICONDUCTOR PACKAGE HAVING A LASER-ACTIVATABLE MOLD COMPOUND

TECHNICAL FIELD

This disclosure relates generally to the field of semiconductor die packaging, and in particular to the field of forming a molded package including a package interconnect.

BACKGROUND

Semiconductor device manufacturers are constantly striving to increase the performance of their products, while decreasing their cost of manufacture. A cost and device performance sensitive area in the manufacture of a semiconductor device is packaging the semiconductor die. Packaging involves encapsulating the semiconductor die and forming an interconnect from die pads to package terminals. The packaging concept and interconnect technology should provide for high electrical and thermal performance and reliability of the semiconductor device. They should further support package scalability and die shrinkage.

Further, many types of semiconductor devices are highly sensitive to parasitic electrical effects such as parasitic interconnect resistance and inductance, parasitic capacitive coupling, etc. For example, switches, power transistors, RF (radio frequency) power amplifiers, low-noise amplifiers (LNAs), antenna tuners, mixers, etc. are each highly sensitive to parasitic electrical effects. Techniques for reducing parasitic electrical effects on a packaged semiconductor device often result in higher overall cost, larger package size, more complex manufacturing process, reduced device performance, etc.

SUMMARY

According to an embodiment of a molded package, the molded package comprises: a laser-activatable mold compound having a plurality of laser-activated regions which are plated with an electrically conductive material to form metal pads and/or metal traces at a first side of the laser-activatable mold compound; a semiconductor die embedded in the laser-activatable mold compound and having a plurality of die pads; and an interconnect electrically connecting the plurality of die pads of the semiconductor die to the metal pads and/or metal traces at the first side of the laser-activatable mold compound.

The laser-activatable mold compound may be a single layer mold compound or a multiple layer mold compound.

If the laser-activatable mold compound is a single layer mold compound, in one embodiment, the interconnect comprises a plurality of wire stud bumps or metal pillars or vertical bond wires attached at a first end to the plurality of die pads of the semiconductor die and attached at a second end opposite the first end to the metal pads and/or metal traces at the first side of the laser-activatable mold compound.

If the laser-activatable mold compound is a multiple layer mold compound, in one embodiment, the interconnect comprises a plurality of wire stud bumps or metal pillars or vertical bond wires attached at a first end to the plurality of die pads of the semiconductor die and attached at a second end opposite the first end to first layer metal structures of a first layer of the laser-activatable mold compound, wherein the first layer of the laser-activatable mold compound having a plurality of laser-activated regions which are plated with an electrically conductive material to form the first layer metal structures.

If the laser-activatable mold compound is a multiple layer mold compound, the molded package further comprises a second layer of the laser-activatable mold compound, wherein the second layer of the laser-activatable mold compound may have a plurality of laser-activated regions which are plated with an electrically conductive material to form second layer metal structures of the second layer of the laser-activatable mold compound, wherein the first layer metal structures of the first layer of the laser-activatable mold compound are electrically connected to the second layer metal structures of the second layer of the laser-activatable mold compound.

Separately or in combination, the molded package may further comprise a solder resist layer covering a portion of the first side of the laser-activatable mold compound so that at the first side only part of the metal pads and/or metal traces are exposed to form landing pads of the molded package.

Separately or in combination, the plurality of die pads may be disposed at a first side of the semiconductor die, a second side of the semiconductor die opposite the first side may not be covered by the laser-activatable mold compound, and the molded package may further comprise either a glob top covering the second side of the semiconductor die or a heat sink metal plate covering the second side of the semiconductor die.

Separately or in combination, the plurality of die pads may be disposed at a first side of the semiconductor die, a second side of the semiconductor die opposite the first side may not be covered by the laser-activatable mold compound, the laser-activatable mold compound may be thicker than the semiconductor die, and the laser-activatable mold compound may have a recessed region at the second side of the semiconductor die.

The recessed region of the laser-activatable mold compound may form an open cavity within the molded package.

Separately or in combination, the molded package may further comprise a heat sink disposed in the recessed region of the laser-activatable mold compound.

Separately or in combination, the metal pads and/or metal traces at the first side of the laser-activatable mold compound may be about 1 μm to about 80 μm thick, e.g. about 5 μm to about 20 μm thick.

Separately or in combination, the semiconductor die may include a power transistor, an RF front end circuit, logic devices or may be a controller.

Separately or in combination, a first one of the metal pads at the first side of the laser-activatable mold compound may be electrically connected to a first one of the die pads of the semiconductor die by the interconnect, and in a vertical projection of a footprint of the first die pad onto the first side of the laser-activatable mold compound, the first metal pad may be positioned outside the footprint of the first die pad.

The first metal pad may be connected to a first one of the metal traces at the first side of the laser-activatable mold compound, and in the vertical projection, the first metal traces may be positioned inside the footprint of the first die pad and vertically aligned with the first die pad.

According to an embodiment of a method of manufacturing a molded package, the method comprises: placing a semiconductor die on a carrier, the semiconductor die having a plurality of die pads facing away from the carrier; attaching at least an initial part of an interconnect to the plurality of die pads of the semiconductor die before or after placing the semiconductor die on the carrier; embedding the semiconductor die and the interconnect in a laser-activatable mold compound; directing a laser at a first side of the laser-activatable mold compound to laser-activate a plurality of regions of the laser-activatable mold compound; and plating an electrically conductive material on the plurality of laser-activated regions of the laser-activatable mold compound to form metal pads and/or metal traces at the first side of the laser-activatable mold compound, wherein the interconnect electrically connects the plurality of die pads of the semiconductor die to the metal pads and/or metal traces at the first side of the laser-activatable mold compound.

In one embodiment, the mold compound may be a multiple layer mold compound. In this case, embedding the semiconductor die and the interconnect in a laser-activatable mold compound comprises embedding the semiconductor die and the initial part of the interconnect in a first layer of the laser-activatable mold compound; directing a laser at the first layer of the laser-activatable mold compound to laser-activate a plurality of regions of the first layer of the laser-activatable mold compound; plating an electrically conductive material on the plurality of laser-activated regions of the first layer of the laser-activatable mold compound to form first layer metal structures at a surface of the first layer of the laser-activatable mold compound, and applying a second layer of the laser-activatable mold compound over the surface of the first layer of the laser-activatable mold compound.

In one embodiment, attaching at least the initial part of the interconnect to the plurality of die pads of the semiconductor die comprises attaching a plurality of wire stud bumps or metal pillars or vertical bond wires to the plurality of die pads of the semiconductor die.

Separately or in combination, the method may further comprise covering a portion of the first side of the laser-activatable mold compound with a solder resist layer so that at the first side only part of the metal pads and/or metal traces are exposed to form landing pads of the molded package.

Separately or in combination, the method may further comprise: after plating the electrically conductive material on the plurality of laser-activated regions of the laser-activatable mold compound, removing the carrier from the semiconductor die to expose a side of the semiconductor die opposite the die pads; and covering the side of the semiconductor die exposed by removing the carrier with a glob top or with a heat sink metal plate.

Separately or in combination, embedding the semiconductor die and the interconnect in the laser-activatable mold compound may comprise covering the interconnect with the laser-activatable mold compound (if the laser-activatable mold compound is a multiple layer mold compound, with the first layer of the laser-activatable mold compound) and the method may further comprise thinning (e.g. by grinding) the laser-activatable mold compound (in particular the first layer of the of laser-activatable mold compound if the laser-activatable mold compound is a multiple layer mold compound) to expose the at least initial part of the interconnect at the side facing away from the carrier.

Separately or in combination, embedding the semiconductor die and the interconnect in the laser-activatable mold compound may comprise covering the interconnect with the laser-activatable mold compound (if the laser-activatable mold compound is a multiple layer mold compound, with the first layer of the laser-activatable mold compound) and the method may further comprise drilling (e.g. by laser or mechanical drilling) holes in the laser-activatable mold compound (in particular in the first layer of the of laser-activatable mold compound if the laser-activatable mold compound is a multiple layer mold compound) to expose at least the initial part of the interconnect at the side facing away from the carrier.

Separately or in combination, the at least initial part of the interconnect may protrude from the laser-activatable mold compound or, if the laser-activatable mold compound comprises a first layer and a second layer, from the first layer of the laser-activatable mold compound at a side facing away from the carrier.

Separately or in combination, the method may further comprise forming a cavity in the laser-activatable mold compound at a side of the semiconductor die opposite the plurality of die pads.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 9A through 9E, 10A through 10E, 11A through 11E, and 12A through 12E each illustrate respective partial cross-sectional views during different stages of manufacturing molded packages having a laser-activatable mold compound for die embedding, according to additional embodiments.

FIGS. 15A through 15F illustrate exemplary perspective views and partial cross-sectional views during different stages of manufacturing molded packages having a single layer laser-activatable mold compound for die embedding.

FIGS. 17A through 17J illustrate exemplary perspective views and partial cross-sectional views during different stages of manufacturing molded packages having a multiple layer laser-activatable mold compound for die embedding.

DETAILED DESCRIPTION

The embodiments described herein provide molded semiconductor packages with low parasitics, and corresponding methods of manufacture. The packages use a laser-activatable mold compound for die (chip) embedding. The laser-activatable mold compound includes at least one additive e.g. in the form of an organic metal complex which is activated by a physio-chemical reaction induced by a focused laser beam. The reaction cracks open the complex compounds in the mold compound and breaks off metal atoms from the organic ligands. The freed metal atoms act as nuclei for metal or metal alloy (e.g. Cu, Ni, NiP, Au, Cu/Ni/Au stack, etc.) coating/plating in regions of the mold compound activated by a laser. The term "laser-activated regions" as used herein mean regions of the laser-activatable mold compound which have already been activated by a laser beam, as opposed to a laser-activatable region of the mold compound which is capable of being activated by laser light but has yet to actually be activated. The laser-activated regions of the mold compound are plated with an electrically conductive material to form metal pads and/or metal traces at one or more sides of the laser-activatable mold compound. Hence, the metal pads and/or metal traces are structured directly on the mold compound without having to use a sophisticated and expensive lead frame. If the laser-activatable mold compound includes multiple layers, layer metal structures on the respective layers of the laser-activatable mold compound may be formed the same way as the metal pads and/or metal traces, i.e. by plating laser-activated regions of the respective layer with an electrically conductive material to form the respective layer metal structures.

Accordingly, the distance between the active circuit and the package I/O (inputs/outputs) is controllable to minimize parasitic electric effects. Also, the metal pads and/or metal traces which may be realized with this approach yield greater design freedom in that the die interconnect (including, e.g., wire stud bumps, metal pillars, vertical bond wires, etc. and, if a multiple layer laser-activatable mold compound is used, the layer metal structures formed on the respective layers) are not required to necessarily reside inside the footprint of a die pad as is the case with a leadframe-type approach. It is to be understood that the features of the various embodiments described herein may be combined with each other, unless specifically noted otherwise.

Figure 1:
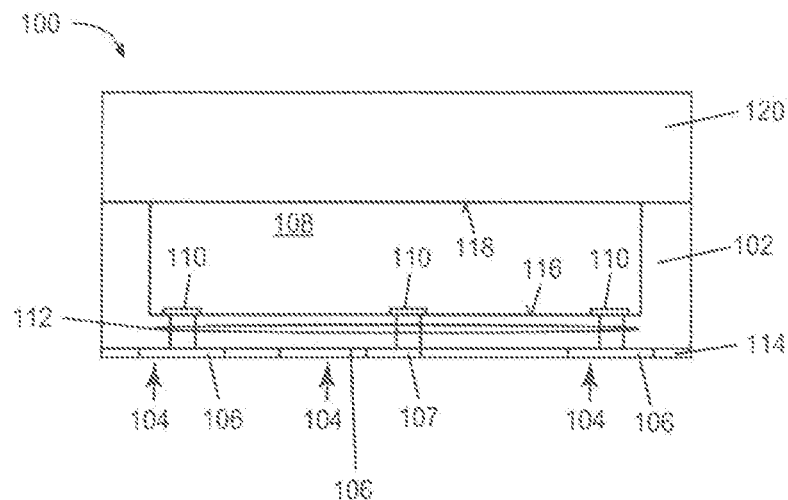
FIG. 1 illustrates a cross-sectional view of an embodiment of a molded package having a laser-activatable mold compound for die (chip) embedding.
Figure 2:
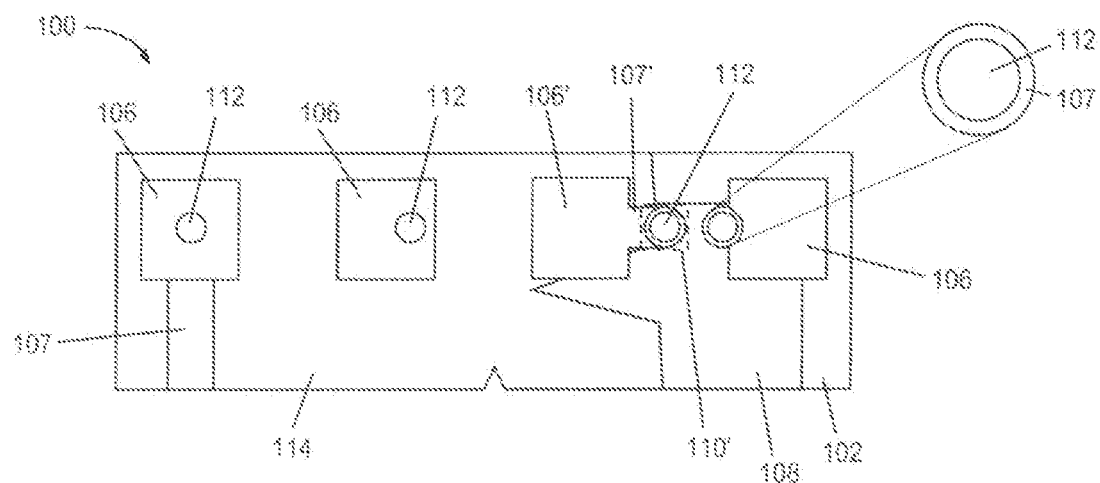
FIG. 2 illustrates a partial plan view of the molded package of FIG. 1.

FIG. 1 illustrates a cross-sectional view of an embodiment of a molded package 100, and FIG. 2 illustrates a partial plan view of the molded package 100. The molded package 100 includes a laser-activatable mold compound 102 having a plurality of laser-activated regions 104 which are plated with an electrically conductive material to form metal pads 106 and/or metal traces 107 at one or more sides of the laser-activatable mold compound 102. At least one semiconductor die 108 is embedded in the laser-activatable mold compound 102 and has a plurality of die pads 110. For example, only one semiconductor die 108 may be embedded in the laser-activatable mold compound 102, or two or more semiconductor dies 108 may be embedded in the laser-activatable mold compound 102. The number and type of semiconductor dies 108 embedded in the laser-activatable mold compound 102 depends on various factors, and should not be considered limiting. For example, one or more semiconductor dies 108 embedded in the laser-activatable mold compound 102 may include an RF front end circuit such as one or more power switches, an RF power amplifier, an LNA, an antenna tuner, a mixer, etc. In addition or alternatively, one of the semiconductor dies 108 embedded in the laser-activatable mold compound 102 may be a power switch, e.g. a power transistor such as, e.g., a GaN transistor, or an array of such power transistors. In addition or alternatively, one or more semiconductor dies 108 embedded in the laser-activatable mold compound 102 may include logic devices. In addition or alternatively, one of the semiconductor dies 108 embedded in the laser-activatable mold compound 102 may be a controller. Again, the number and type of semiconductor dies 108 embedded in the laser-activatable mold compound 102 depends on various factors should not be considered limiting.

Figure 3A:
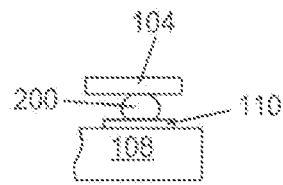
FIG. 3A illustrates a cross-sectional view of an exemplary wire stud bump interconnect which may be used in the molded package of FIG. 1.
Figure 3B:
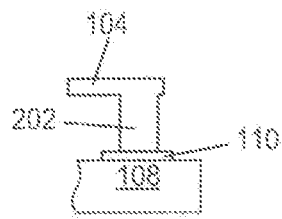
FIG. 3B illustrates a cross-sectional view of an exemplary pillar interconnect which may be used in the molded package of FIG. 1.
Figure 3C:
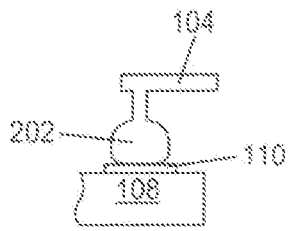
FIG. 3C illustrates a cross-sectional view of an exemplary vertical bond wire interconnect which may be used in the molded package of FIG. 1.

The molded package 100 also includes an interconnect 112 for connecting the die pads 110 of each embedded semiconductor die 108 to corresponding ones of the metal pads 106 and/or metal traces 107 formed at one or more sides of the laser-activatable mold compound 102. Any type of interconnect 112 may be used. For example, the interconnect 112 may include wire stud bumps made of a metal such as copper, gold, aluminium, nickel, etc. or a metal alloy attached at a first end to the die pads 110 and attached at a second end opposite the first end either to the metal pads 106 and/or metal traces 107 of a (single layer) laser-activatable mold compound 102 or to first layer metal structures of a first layer of a multiple layer laser-activatable mold compound 102. An exemplary wire stud bump 200 is shown in FIG. 3A. In another embodiment, the interconnect 112 includes metal pillars made of a metal such as copper, gold, aluminium, nickel, etc. or a metal alloy attached at a first end to the die pads 110 and attached at a second end opposite the first end to the metal pads 106 and/or metal traces 107. An exemplary pillar 202 is shown in FIG. 3B. In yet another embodiment, the interconnect 112 includes vertical bond wires attached at a first end to the die pads 110 and attached at a second end opposite the first end to the metal pads 106 and/or metal traces 107. The second (distal) end is formed by cutting the bond wire after the first (proximal) end is bonded to the corresponding die pad 110. Bond wires tend to be thinner than wire stud bumps and metal pillars, resulting is less capacitive coupling between neighboring pads. Also, larger lengths are possible, allowing for more distance between the metal pads and/or metal traces and the semiconductor die. An exemplary vertical bond wire 204 is shown in FIG. 3C. The laser-activatable mold compound 102 is not shown in FIGS. 3A through 3C for ease of illustration of the respective interconnect structures 200, 202, 204. Still other types of interconnects may be used, e.g., such which include solder bumps. As will be described in more detail further below, the laser-activated regions 104 which are plated with an electrically conductive material may either be located at the periphery of the laser-activatable mold compound 102 to form metal pads 106 and/or metal traces 107 or at the first layer of a multiple layer laser-activatable mold compound 102 to form first layer metal structures.

The molded package 100 may also include a solder resist layer 114 such as a lacquer, epoxy, liquid photoimageable solder mask, dry-film photoimageable solder mask, etc. which covers a portion of the side of the laser-activatable mold compound 102 with the metal pads 106 and/or metal traces 107, so that only part of the metal pads 106 and/or metal traces 107 are exposed at that side to form landing pads of the molded package 100. External connections may be made to the landing pads of the molded package 100, e.g., by soldering to a printed circuit board (PCB), another molded package, etc.

In one embodiment, the die pads 110 are disposed at one side 116 of the semiconductor die and a second side 118 of the die 108 opposite the first side 116 is not covered by the laser-activatable mold compound 102. The molded package 100 may instead further include a glob top or other type of protective material 120 covering the second side 118 of the semiconductor die 108. In the case of a glob top, the glob top serves as an encapsulation which protects the semiconductor die 108. A glob top may be placed over the semiconductor die 108 as an environmental barrier, mechanical reinforcement, tamper proof layer, etc. There are two main types of glob tops: single material hemispherical and two material dam-and-fill. Alternatively, the second side 118 of the die 108 opposite the first side 116 may be covered by a heat sink metal plate. In other embodiments, the second side 118 of the semiconductor die 108 may or may not have die pads 110 and is at least partly covered by the laser-activatable mold compound 102. In other embodiments, the As previously described herein, the metal pads 106 and/or metal traces 107 formed at one or more sides of the laser-activatable mold compound 102 are not necessarily required to reside inside the die pad footprint. For example, a first one 106' of the metal pads 106 may be electrically connected to a first one 110' of the die pads 110 by the interconnect 112. The first die pad 110' is illustrated as a dashed box in FIG. 2 since the first die pad 110' is covered and therefore out of view. The solder resist layer 114 is shown partially removed in FIG. 2, to illustrate part of the laser-activatable mold compound 102 and part of the semiconductor die 108 having the first die pad 110' mentioned above. In a vertical projection (coming out of the page in FIG. 2) of the footprint of the first die pad 110' onto the side of the laser-activatable mold compound 102 with the first metal pad 106', the first metal pad 106' may be positioned outside the footprint of the first die pad 110'. The same first metal pad 106' may be connected to a first one 107' of the metal traces 107 at the same side of the laser-activatable mold compound 102 as the first metal pad 106'. In the vertical projection, the first metal trace 107' may be positioned at least partly inside the footprint of the first die pad 110' and therefore vertically aligned with the first die pad 110'.

The size, shape and layout of the metal pads 106 and/or metal traces 107 formed at one or more sides of the (single layer or multiple layer) laser-activatable mold compound 102 depends on various factors and should not be considered limiting. For example, in the case of an RF package, the thickness of the metal pads 106 and/or metal traces 107 may range from about 10 μm (microns) to about 15 μm. The metal pads 106 and/or metal traces 107 may be even thinner, e.g., in the range of about 5 μm to about 10 μm. For high power applications (e.g. power transistors), the thickness of the metal pads 106 and/or metal traces 107 may be even greater, e.g., about 20 μm to about 40 μm or even thicker. For example, the metal pads 106 and/or metal traces 107 may have a thickness of about 1 μm to about 80 μm. Thicker metal pads 106 and/or metal traces 107 may be preferred in view of ohmic losses, whereas thinner metal pads 106 and/or metal traces 107 may be preferred to keep the capacitance low. For an RF application that does not involve power conversion, the skin effect limits the usefulness of thicker metal pads 106 and/or metal traces 107. The positioning of the metal pads 106 and/or metal traces 107 relative to the die pads 110 also depends on various factors and should not be considered limiting.

Figure 4:
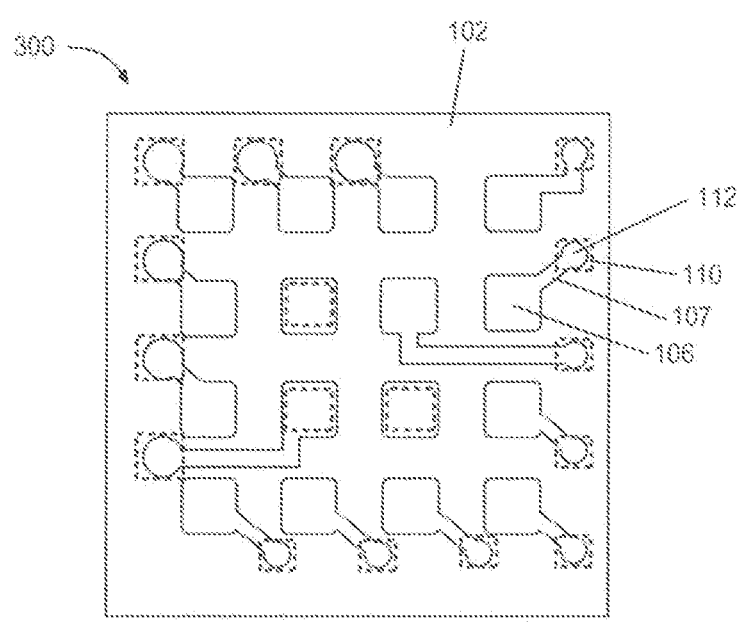
FIG. 4 illustrates a cross-sectional view of another embodiment of a molded package having a laser-activatable mold compound for die embedding.

FIG. 4 illustrates a plan view of another embodiment of a molded package 300 having the laser-activatable mold compound 102, at least one semiconductor die (out of view) embedded in the laser-activatable mold compound 102, and an interconnect 112 connecting die pads 110 of the semiconductor die to the metal pads 106 and/or metal traces 107 at one or more sides of the laser-activatable mold compound 102. According to this embodiment, some of the metal pads 106 and metal traces 107 reside entirely or partly inside the footprint of the respective die pads 110 and other ones of the metal pads 106 and metal traces 107 reside outside the footprint of the respective die pads 110 in a vertical projection (coming out of the page in FIG. 4) of the molded package 300. The die pads 110 are illustrated as dashed boxes in FIG. 4 since the die pads 110 are out of view. Only a single instance of a die pad 110, interconnect 112, metal pad 106 and metal trace 107 are labelled in FIG. 4 to reduce obfuscation of the drawing and aid in understanding. The metal pads 106 have a generally square shape, the metal traces 107 have a generally rectangular shape, and the interconnect 112 has a generally circular shape to clearly distinguish between these different elements of the molded package 300. Again, the size, shape, layout and positioning of the metal pads 106 and/or metal traces 107 formed at one or more sides of the laser-activatable mold compound 102 depends on various factors and should not be considered limiting. The size, shape and layout of the interconnect 112 also depends on various factors including interconnect type (e.g. wire stud bumps, metal pillars, vertical bond wires, etc.), and therefore should not be considered limiting.

Described next are various method embodiments for manufacturing a molded package having the laser-activatable mold compound and interconnect features described herein. In the following description, a single layer laser-activatable mold compound is used as an example. However, the description is analogously applicable to embodiments using a multiple layer laser-activatable mold compound, in particular to the first layer of the multiple layer laser-activatable mold compound.

FIGS. 5A through 5E illustrate respective partial cross-sectional views during different stages of manufacturing the molded packages described herein, according to an embodiment.

Figure 5A:
FIGS. 5A through 5E illustrate respective partial cross-sectional views during different stages of manufacturing molded packages having a laser-activatable mold compound for die embedding, according to an embodiment.

FIG. 5A shows a plurality of semiconductor dies 108 attached to a temporary carrier 400 such as a metal plate, plastic plate or film, foil, tape, etc., with interconnects 112 facing away from the carrier 400. The semiconductor dies 108 may be attached to the carrier 400 using a glue or a double-sided tape, for example, via a single unit placement process. In another embodiment, the semiconductor dies 108 may be attached to the carrier 400 by first attaching the dies 108 to a wafer (not shown) and laminating the wafer to the carrier 400.

Each interconnect 112 may include wire stud bumps, metal pillars, vertical bond wires, etc., as previously described herein. The semiconductor dies 108 were singulated from a semiconductor wafer (not shown), e.g. by sawing, prior to being attached to the carrier 400. In general, the semiconductor wafer and therefore the resulting semiconductor dies 108 may be made of any semiconductor material suitable for manufacturing a semiconductor device. Examples of such materials include, but are not limited to, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), etc.

The semiconductor dies 108 are embedded in a laser-activatable mold compound 102 of the kind previously described herein, after the dies 110 are attached to the carrier 400. According to this embodiment, the semiconductor dies 110 are over-molded in that the side of the dies 108 with the interconnects 112 is covered by an appreciable amount of the laser-activatable mold compound 102, meaning that the mold compound 102 will have to be thinned to expose the interconnects 112.

Figure 5B:

FIG. 5B shows the structure after the laser-activatable mold compound 102 is thinned to exposed the interconnects 112 connected to the die pads 110 of the semiconductor dies 108. In one embodiment, the laser-activatable mold compound 102 is thinned by grinding until the interconnects 112 are exposed.

Figure 5C:
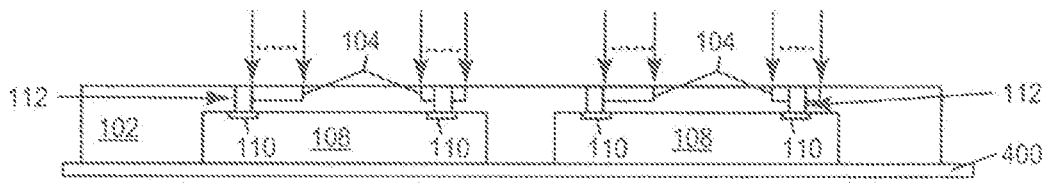

FIG. 5C shows the structure during laser activation of different regions of the laser-activatable mold compound 102. The downward-facing arrows indicate a laser being directed at the side of the laser-activatable mold compound 102 with the exposed interconnects 112, thereby laser activating different of regions 104 of the mold compound 102. As previously described herein, metal atoms freed by laser activation act as nuclei metal or metal alloy (e.g. Cu, Ni, NiP, Au, Cu/Ni/Au stack, etc.) coating/plating in regions 104 of the mold compound 102 defined by the laser. Suitable polymers for such laser direct structuring of the laser-activatable mold compound 102 may include, but are not limited to, thermoset polymers having a resin base, ABS (acrylonitrile butadiene styrene), PC/ABS (polycarbonate/acrylonitrile butadiene styrene), PC (polycarbonate), PA/PPA (polyimide/polyphthalamide), PBT (polybutylene terephthalate), COP (cyclic olefin polymer), PPE (polyphenyl ether), LCP (liquid-crystal polymer), PEI (polyethylenimine or polyaziridine), PEEK (polyether ether ketone), PPS (polyphenylene sulfide), etc.

Figure 5D:
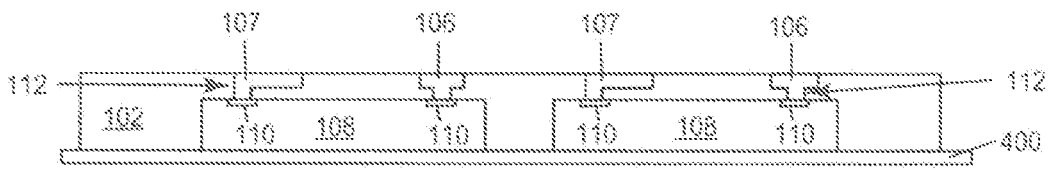

FIG. 5D shows the structure after plating an electrically conductive material on the plurality of laser-activated regions 104 of the laser-activatable mold compound 102 to form metal pads 106 and/or metal traces 107 at the side of the laser-activatable mold compound 102 with the exposed interconnects 112. Each interconnect 112 electrically connects the corresponding die pads 110 to the corresponding metal pads 106 and/or metal traces 107 for that molded package. The plating process may begin with a cleaning step to remove laser debris and may be followed by an additive build-up of plated metal, metal alloy or metal stack to form the metal pads 106 and/or metal traces 107, e.g., using a current-free Cu bath in the case of Cu metal pads 106 and/or metal traces 107. If greater thickness of copper is required, a standard electroforming Cu bath may be used. One or more application-specific coatings such as Ni, Au, Sn, Sn/Pb, Ag, Ag/Pd, etc., may also be applied to the metal pads 106 and/or metal traces 107.

Figure 5E:
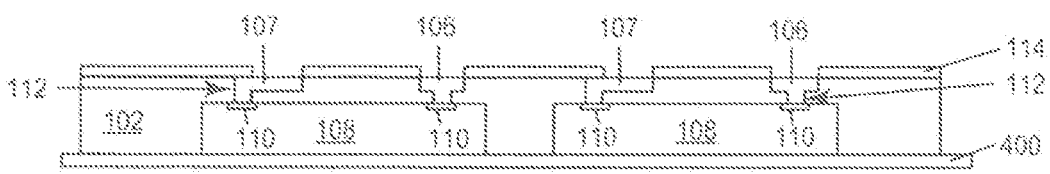

FIG. 5E shows the structure after covering a portion of the side of the laser-activatable mold compound 102 having the metal pads 106 and/or metal traces 107 with a solder resist layer 114, so that only part of the metal pads 106 and/or metal traces 107 are exposed to form landing pads of each molded package. The solder resist layer 114 may be a lacquer, epoxy, liquid photoimageable solder mask, dry-film photoimageable solder mask, etc. The structure may then be re-laminated to another carrier (not shown) with the landing pads facing the new carrier, and the old carrier may be removed. The structure may then be thinned at the side from which the original carrier was removed, e.g. by grinding. A glob top may be applied to this side of the structure, protecting the exposed side of each semiconductor die 108. Individual molded packages are then singulated, e.g., by sawing through the structure between adjacent packages.

Figure 6A:
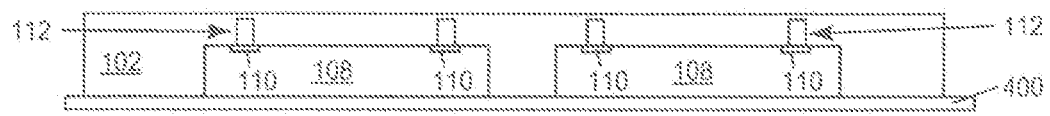
FIGS. 6A through 6E illustrate respective partial cross-sectional views during different stages of manufacturing molded packages having a laser-activatable mold compound for die embedding, according to another embodiment.
Figure 6B:
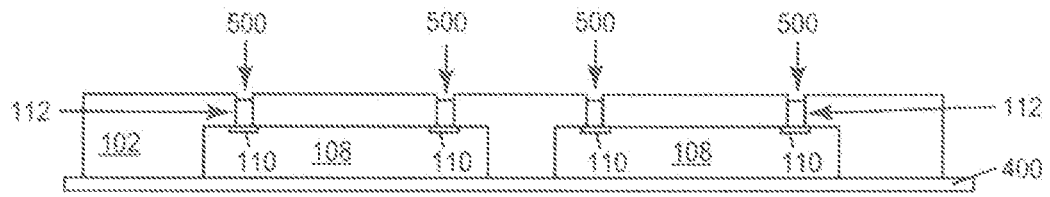
Figure 6C:
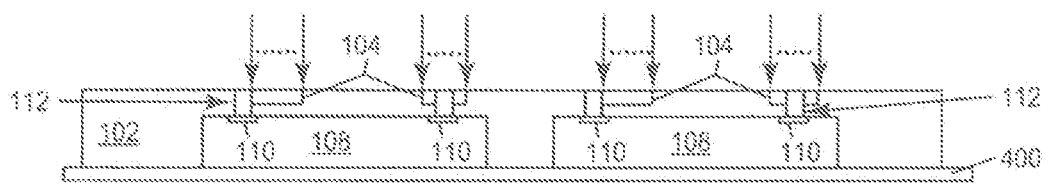
Figure 6D:
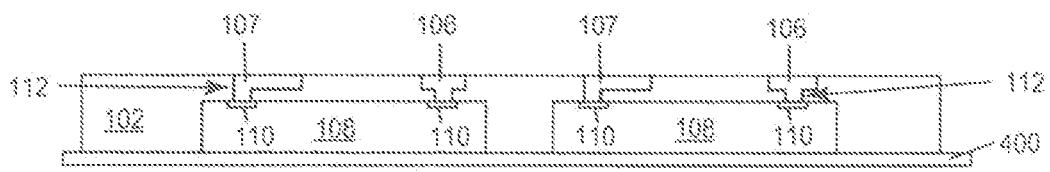
Figure 6E:
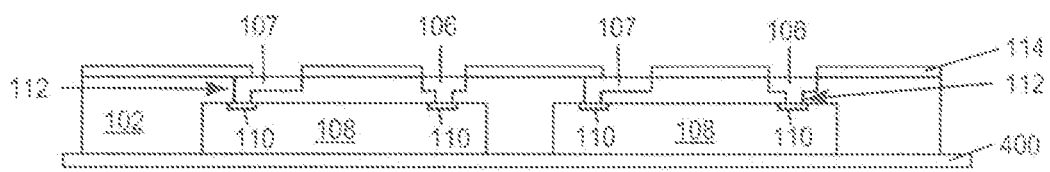

FIGS. 6A through 6E illustrate respective partial cross-sectional views during different stages of manufacturing the molded packages described herein, according to another embodiment. The embodiment shown in FIGS. 6A through 6E is similar to the embodiment shown in FIGS. 5A through 5E. Different, however, in FIG. 6A the semiconductor dies 108 are only slightly over-molded by an inappreciable amount of the laser-activatable mold compound 102, e.g. by about 5 μm to about 20 μm, meaning that the interconnects 112 may be exposed by drilling (e.g. by laser or mechanical drilling) of the mold compound 102 instead of grinding. FIG. 6B shows the structure after the drilling process, which forms holes (openings) 500 in the laser-activatable mold compound 102 to expose the interconnects 112. FIGS. 6C through 6E are identical to FIGS. 5C through 5E, respectively.

Figure 7A:
FIGS. 7A through 7D illustrate respective partial cross-sectional views during different stages of manufacturing molded packages having a laser-activatable mold compound for die embedding, according to yet another embodiment.
Figure 7B:
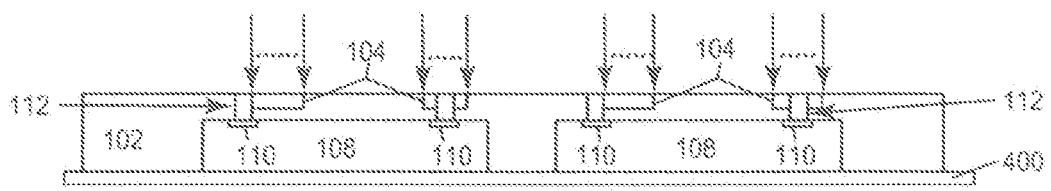
Figure 7C:
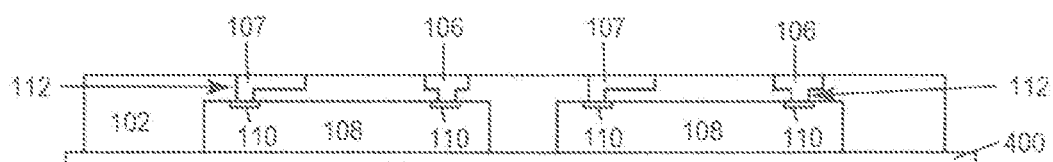
Figure 7D:
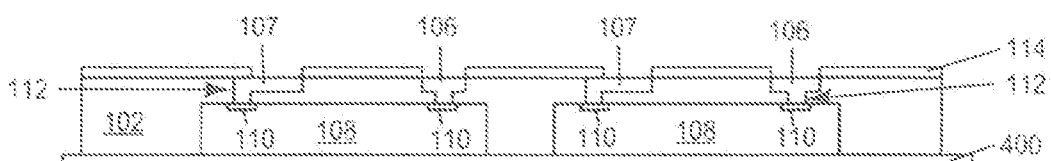

FIGS. 7A through 7D illustrate respective partial cross-sectional views during different stages of manufacturing the molded packages described herein, according to yet another embodiment. The embodiment shown in FIGS. 7A through 7D is similar to the embodiment shown in FIGS. 5A through 5E. Different, however, in FIG. 7A the interconnects 112 protrude from the laser-activatable mold compound 102 at the side of the interconnects 112 facing away from the carrier 400 after embedding the semiconductor dies 108 and the interconnects 112 in the laser-activatable mold compound 102. For example, a rubber element may be placed in the jig used to mold the structure. The rubber element prevents the laser-activatable mold compound 102 from fully encasing the interconnects 112. This way, thinning (e.g. by grinding) or drilling (e.g. by laser or mechanical drilling) of the laser-activatable mold compound 102 to expose the interconnects 112 may be avoided. The interconnects 112 may be thinned, e.g., by grinding after the molding process, so that the interconnects 112 and the side of the laser-activatable mold compound 102 at which the interconnects 112 terminate are generally planar. FIGS. 7B through 7D are identical to FIGS. 5C through 5E, respectively.

In the single layer laser-activatable mold compound 102 embodiments described in FIGS. 5A-5E, 6A-6E and 7A-7D, the interconnect 112 may solely be made of the wire stud bumps, metal pillars, or vertical bond wires, etc., as previously described herein. However, in a multiple layer laser-activatable mold compound 102 the interconnect 112 further comprises an electrical redistribution structure formed by respective layer metal structures of the respective layers of the laser-activatable mold compound. In this case, the interconnect 112 running through the first layer (e.g. the wire stud bumps, metal pillars, or vertical bond wires, etc.,) could be regarded as an initial part of the interconnect while the residual interconnect is formed by the electrical redistribution structure running through the other layers of the multiple layer laser-activatable mold compound 102.

Figure 8:
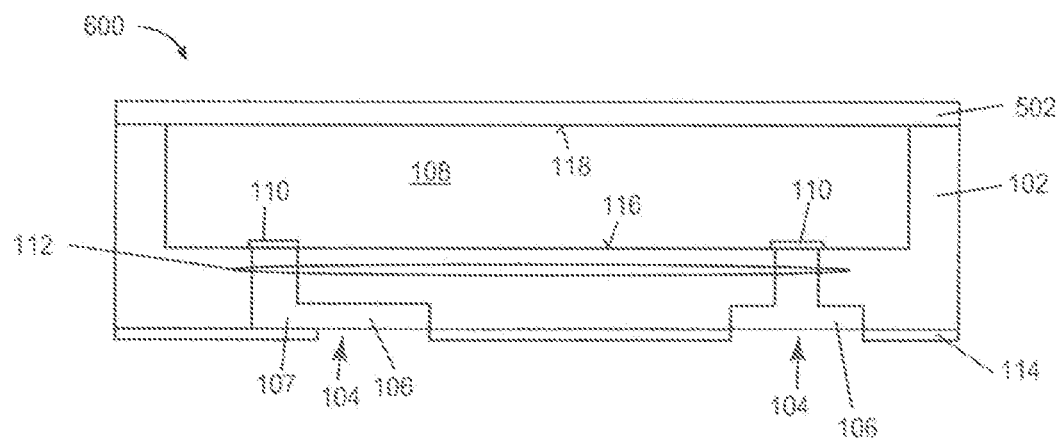
FIG. 8 illustrates a cross-sectional view of a molded package produced by any one of the methods illustrated in FIGS. 5A through 5E, FIGS. 6A through 6E, or FIGS. 7A through 7D.

FIG. 8 illustrates a cross-sectional view of a molded package 600 produced by any one of the methods illustrated in FIGS. 5A through 5E, FIGS. 6A through 6E, or FIGS. 7A through 7D. A glob top 502 covers the backside 118 of the semiconductor die 108, which may or may not have been thinned prior to application of the glob top 120. An element other than a glob top may adjoin the backside 118 of the semiconductor die 108. For example, a heat sink formed e.g. by a metal plate (not shown) may be attached to the exposed backside 118 of the semiconductor die 108, or a cavity may be formed in the laser-activatable mold compound 102 at the die backside 118.

FIGS. 9A through 9E, 10A through 10E, 11A through 11E, and 12A through 12E each illustrate respective partial cross-sectional views during different stages of manufacturing the molded packages described herein, according to additional embodiments.

Figure 11A:
Figure 12A:
Figure 11B:
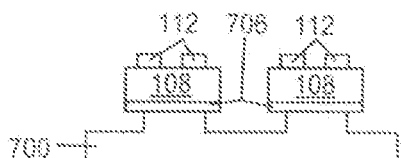

In FIGS. 9A, 10A, 11A, and 12A, a carrier 700 such as a metal plate, plastic plate or film, foil, tape, etc. is provided. In FIG. 9A, the carrier 700 is unstructured prior to die attach. In FIG. 10A, the carrier 700 is structured prior to die attach. In FIG. 11A, the carrier 700 has standoffs 702. In FIG. 12A, a spacer material 704 is applied to the carrier 700 prior to die attach. The spacer material 704 allows for a certain insulating distance at the backside of the dies. The spacer material 704 may be removed later to form a cavity, e.g. in the case of a MEMS (Microelectromechanical systems) or sensor application, or to be replaced with a heat sink at the backside of the dies. The spacer material 704 also provides a buffer so that the dies do not come into contact with chemicals subsequently used to remove the carrier.

Figure 12B:
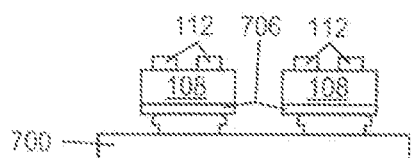
Figure 12C:
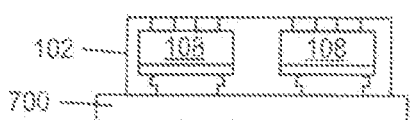
Figure 12D:
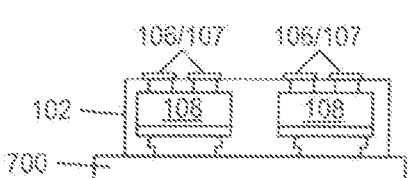

FIGS. 9B, 10B, 11B and 12B show the respective carriers after attachment of the semiconductor dies 108 using a die attach material 706 such as solder, adhesive tape, glue, etc. In the case of FIG. 12B, the spacer material 704 may serve as the die attach material.

FIGS. 9C, 10C, 11C and 12C show the respective structures after molding of the semiconductor dies 108 with the laser-activatable mold compound 102, and may correspond to any of the embodiments previously described herein in connection with FIGS. 5A-5B, 6A-6B and 7A. That is, the die interconnects 112 may be exposed by thinning (e.g. by grinding) of the laser-activatable mold compound 102 (e.g. FIG. 5B), drilling (e.g. by laser or mechanical drilling) of the laser-activatable mold compound 102 (e.g. FIG. 6B), or by modifying the molding jig so that the interconnects 112 protrude from the laser-activatable mold compound 102 without having to thin or laser drill the mold compound 102 (e.g. FIG. 7A).

FIGS. 9D, 10D, 11D and 12D show the respective structures after laser-activating different regions of the laser-activatable mold compound and plating an electrically conductive material on the laser-activated regions of the laser-activatable mold compound to form metal pads 106 and/or metal traces 107, and may correspond to any of the embodiments previously described herein in connection with FIGS. 5C-5D, 6C-6D and 7B-7C.

Figure 11C:
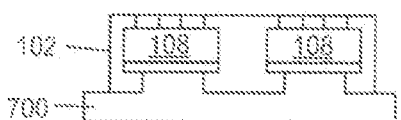
Figure 11D:
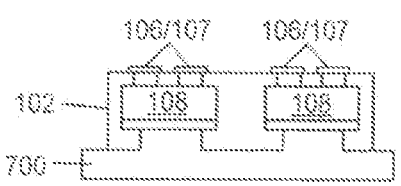
Figure 11E:
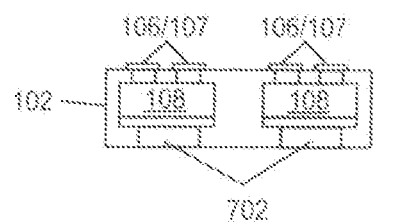
Figure 12E:
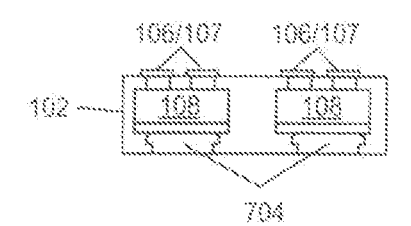

FIGS. 9E, 10E, 11E and 12E show the respective structures after (optional) removal of the carrier 700. In the case of FIG. 9E, the backside of the semiconductor dies 108 or the die attach material 706 at the die backsides (if not removed) is exposed and generally planar with the backside of the laser-activatable mold compound 102. As will be described in more detail further below, the carrier 700 may also remain at the backside of the laser-activatable mold compound 102, in particular if the carrier 700 is formed as a heat sink (e.g. a metal plate) and/or the die 108 is a power die (e.g. power transistor). In the case of FIG. 10E, the die pads (not shown) are disposed at a first side of each die 108, the (opposite) second side of each die 108 is not covered by the laser-activatable mold compound 102, the laser-activatable mold compound 102 is thicker than the semiconductor dies 108, and the laser-activatable mold compound 102 has a recessed region 708 at the second side of the semiconductor dies 108 which is formed by removing the structured carrier 700. The recessed regions 708 may be filled with a heat sink material or may remain unfilled to form a cavity, e.g. in the case of a MEMS or sensor application. In the case of FIG. 11E, the laser-activatable mold compound 102 contacts the backside of the dies 108 around a periphery of the dies 108 due to the use of the standoffs 702. The standoffs 702 may remain in the final molded packages, or may be removed, e.g., to form respective cavities. In the case of FIG. 12E, the spacer material 704 may remain in the final molded packages or may be removed, e.g., to form a respective cavities.

Figure 13:
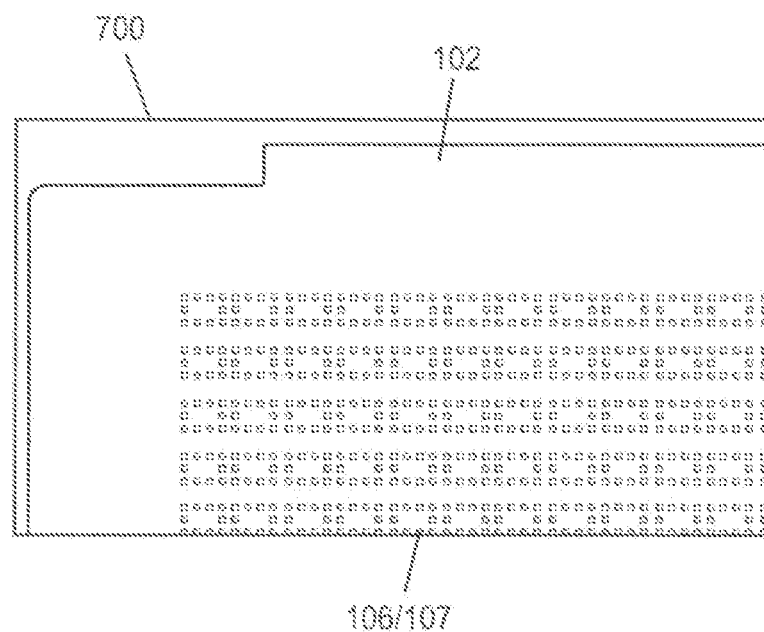
FIG. 13 illustrates a partial plan view of the structure produced by any one of the methods illustrated in FIGS. 9A through 9E, 10A through 10E, 11A through 11E, and 12A through 12E, after the plating process and prior to carrier removal.

FIG. 13 illustrates a partial plan view of the structure produced by any one of the methods illustrated in FIGS. 9A through 9E, 10A through 10E, 11A through 11E, and 12A through 12E, after the plating process and prior to carrier removal. The metal pads 106 and/or metal traces 107 are visible for several packages prior to singulation. Only a single instance of a metal pad 106/metal trace 107 is labelled in FIG. 13 to reduce obfuscation of the drawing and aid in understanding.

Figure 14:
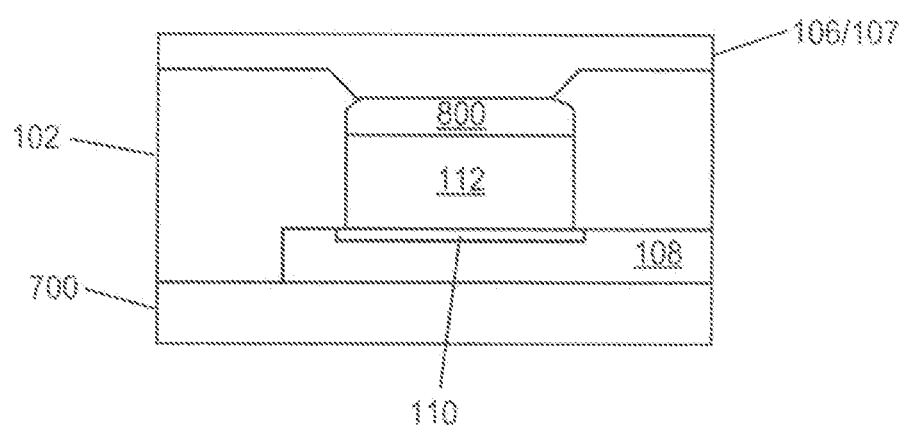
FIG. 14 illustrates a cross-sectional view through one interconnect, one die pad and one metal pad/metal trace produced by any one of the methods illustrated in FIGS. 9A through 9E, 10A through 10E, 11A through 11E, and 12A through 12E, after the plating process and prior to carrier removal.

FIG. 14 illustrates a cross-sectional view through one interconnect 112, one die pad 110 and one metal pad/metal trace 106/107 produced by any one of the methods illustrated in FIGS. 9A through 9E, 10A through 10E, 11A through 11E, and 12A through 12E, after the plating process and prior to carrier removal. One or more application-specific coatings 800 such as Ni, Au, Sn, Sn/Pb, Ag, Ag/Pd, etc., may be applied to the interconnect 112 as shown in FIG. 14.

FIG. 15A illustrates a semiconductor die 108 which is attached to a carrier 400. In this case, the carrier 400 is a permanent carrier, e.g. a metal plate acting as a heat sink. The semiconductor die 108 may, e.g., be a power die. For instance, the semiconductor die 108 may be a horizontal semiconductor device having die pads 110 (only) at its upper surface. As an example, the semiconductor die 108 may be a power transistor (e.g. a GaN power transistor or, in particular, a power GaN HEMT (high electron mobility transistor)) having a source (S) die pad 110, a gate (G) die pad 110 and a drain (D) die pad 110 at its upper surface.

The semiconductor die 108 may be conductively attached (e.g. soldered) to the permanent carrier 400. Further, a metal bar 1510 may be conductively attached to the permanent carrier 400.

FIG. 15B illustrates the attachment of the die interconnect 112 (including, e.g., wire stud bumps, metal pillars, vertical bond wires, etc.) onto the die pads 110 of the semiconductor die 108.

FIG. 15C illustrates embedding the semiconductor die 108 and the interconnect 112 in a (first) laser-activatable mold compound 102, see the description above.

FIG. 15D illustrates exposing the interconnect 112 at the side facing away from the carrier 400 (see the uppermost illustration in FIG. 15D). As has been described earlier, this may include, e.g., thinning or drilling holes. Further, FIG. 15D illustrates laser activation of a plurality of regions of the laser-activatable mold compound 102. Laser activation will also be referred to as laser direct structuring (LDS) in the following. In this case, LDS is used to create laser-activated regions 104 serving as source (S) gate (G) and drain (D) regions. Further, FIG. 15D illustrates plating the laser-activated regions 104 with an electrically conductive material to form metal pads 106, in this case source (S), drain (D) and gate (G) metal pads 106. The metal pads 106 electrically connect to the interconnect 112. As mentioned earlier, the plating may include Cu and/or NiP and/or Au plating.

Figure 15E:
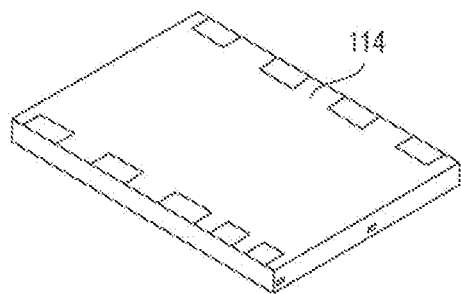

FIG. 15E illustrates masking the metal pads 106 partly with a resist layer 114 as described earlier.

Figure 15F:
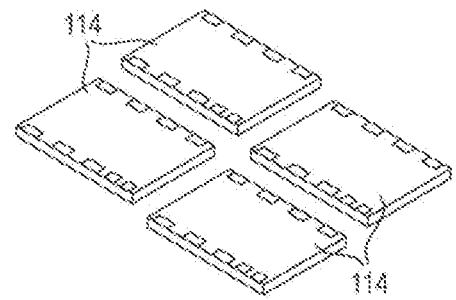

Referring to FIG. 15F, as described earlier individual molded packages may then be singulated, e.g., by sawing through the structure between adjacent packages.

Figure 16:
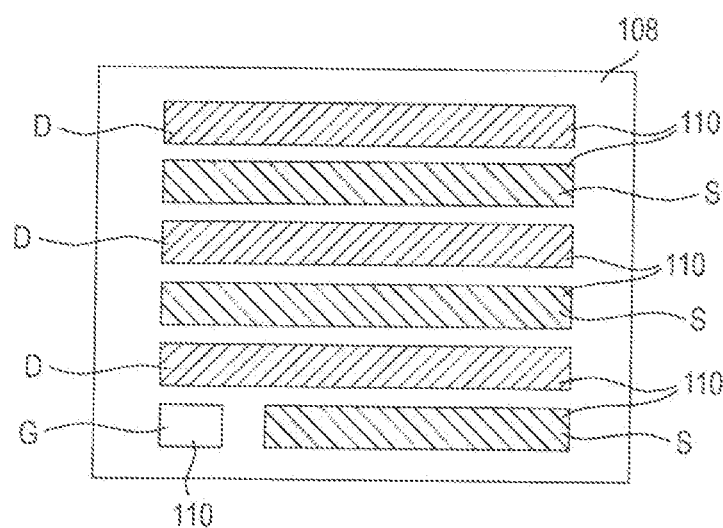
FIG. 16 illustrates a plan view of an exemplary power transistor having multiple source and drain regions.

FIG. 16 illustrates a plan view on a semiconductor die 108. The semiconductor die 108 is a horizontal power transistor, e.g., a GaN transistor. As apparent from FIG. 16, the die pads 110 of the semiconductor die 108 are designed, e.g., as alternating drain (D) and source (S) pads and one gate (G) pad.

In these and other cases, the interconnect may further include an electrical redistribution structure interconnecting the die pads 110 and the metal pads 106 and/or metal traces 107 formed on the laser-activatable mold compound 102. To this end, the laser-activatable mold compound 102 may be formed as a multiple layer mold compound. As will be described in more detail below, each layer of the multiple layer mold compound is individually molded, laser-activated and plated during the process of manufacturing a multiple layer mold compound package.

Figure 17A:
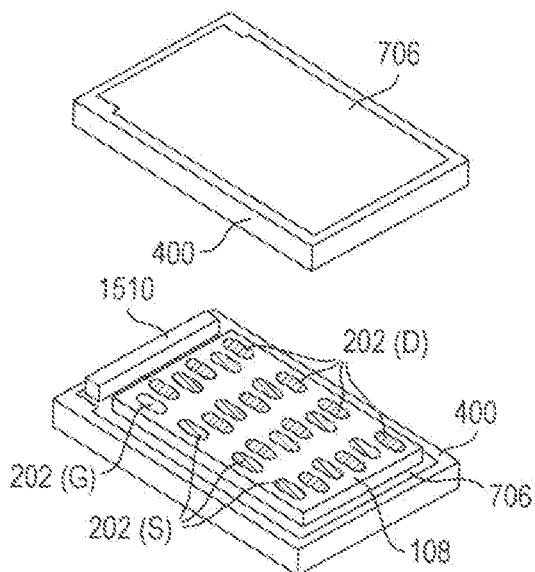

Referring to FIG. 17A, a semiconductor die such as, e.g., the semiconductor die 108 shown in FIG. 16 is attached to a carrier 400 which is, e.g., a permanent carrier 400. An initial part of the interconnect including, e.g., wire stud bumps or metal pillars or vertical bond wires is already attached to the plurality of die pads 110 of the semiconductor die 108. A die attach material 706, as described earlier, may be used to attach the semiconductor die 108 to the permanent carrier 400. Further, a metal bar 1510 may be attached to the permanent carrier 400. The metal bar 1510 (e.g. made of Cu) may electrically and thermally interconnect between the permanent carrier 400 (e.g. heat sink metal plate for top side cooling) and the plated I/O (input/output) at the upper surface of the mold compound 102.

Figure 17B:
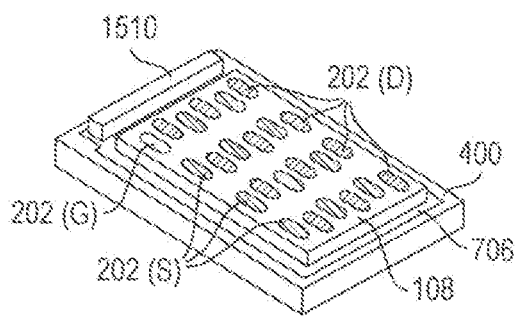

Alternatively, it is possible that the initial part of the interconnect (e.g. wire stud bumps or metal pillars or vertical bond wires) is attached to the plurality of die pads 110 of the semiconductor die 108 after the semiconductor die 108 has been attached to the carrier 400, see FIG. 17B.

In the example of FIGS. 17A and 17B metal pillars 202 are used as an example to illustrate an initial part of the interconnect.

Figure 17C:
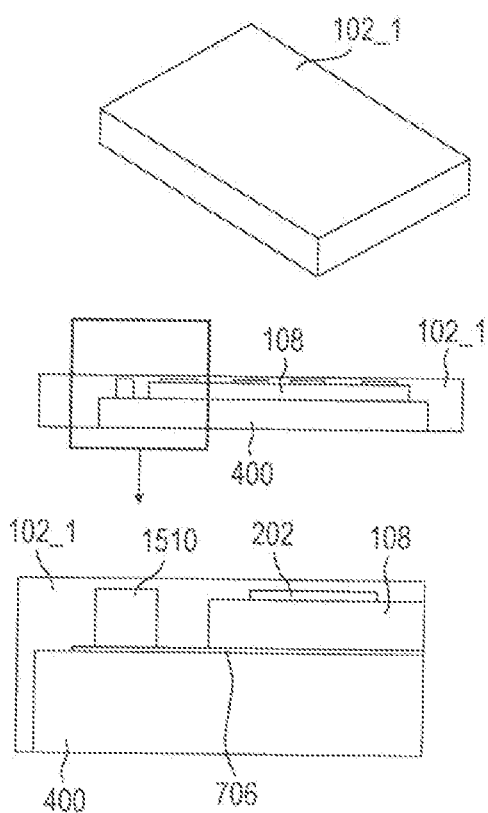

Referring to FIG. 17C, the semiconductor die 108 and the initial part of the interconnect (e.g. the pillars 202) and, optionally, the permanent carrier 400 are embedded in a first layer 102_1 of the laser-activatable mold compound 102. This process may be identical to the process described in conjunction with FIG. 15C. Further, a process of, e.g., thinning or drilling holes may be applied to the first layer 102_1 of the laser-activatable mold compound 102 to expose the initial part of the interconnect.

Figure 17D:
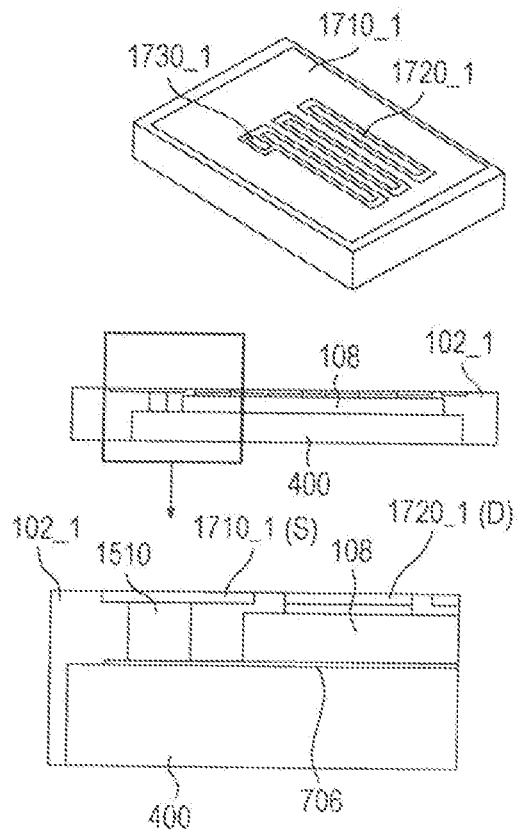

Referring to FIG. 17D, a laser is directed to the first layer 102_1 of the laser-activatable mold compound 102 to laser-activate a plurality of regions of the first layer 102_1 of the laser-activatable mold compound 102. This LDS process is then followed by plating an electrically conductive material on the plurality of laser-activated regions of the first layer 102_1 of the laser-activatable mold compound 102 to form first layer metal structures 1710_1, 1720_1, 1730_1 at a surface of the first layer 102_1 of the laser-activatable mold compound 102. In the example of FIG. 17D the first layer metal structure 1710_1 connects to the source (S), the first layer metal structure 1720_1 connects to the drain (D) and the first layer metal structure 1730_1 connects to the gate (G) of the semiconductor die 108.

Referring to FIG. 17E, a second layer 102_2 of the laser-activatable mold compound 102 is applied over the surface of the first layer 102_1 of the laser-activatable mold compound 102.

Referring to FIG. 17F, a (e.g. second) LDS process followed by a plating process is carried out for the second layer 102_2 of the laser-activatable mold compound 102 to form second layer metal structures 1710_2, 1720_2 and 1730_2 at the surface of the second layer 102_2 of the laser-activatable mold compound 102.

Referring to FIG. 17G, a further (e.g. third) LDS process and a further plating process may be carried out on the second layer 102_2 of the laser-activatable mold compound 102. In this example, the further LDS process and the further plating process provide for reshaping the second layer metal structures 1710_2, 1720_2, 1730_2 into second layer metal structures 1710_2', 1720_2' and 1730_2', respectively.

Referring to FIG. 17H, a third layer 102_3 of the laser-activatable mold compound 102 may be applied over the surface of the second layer 102_2 of the laser-activatable mold compound 102. All mold compound layers 102_1, 102_2, 102_3 may be applied in individual mold tools having individual (gradually increasing) mold cavity dimensions.

Figure 17I:
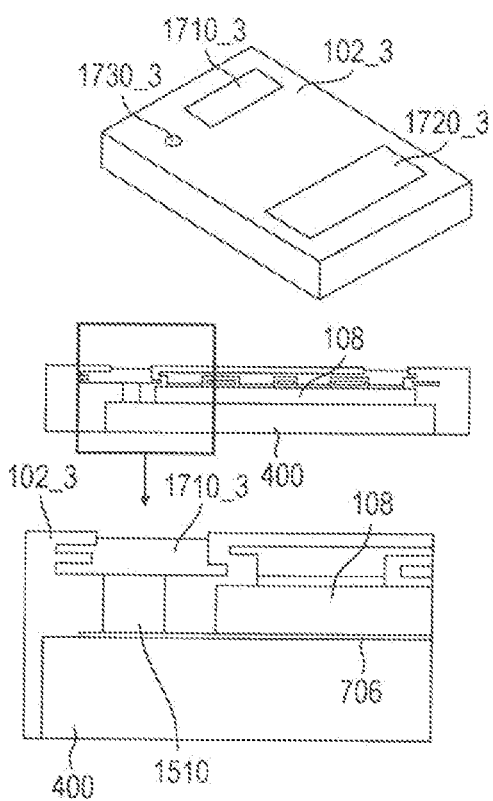

FIG. 17I illustrates another (e.g. fourth) LDS process and plating process applied to the third layer 102_3 to form third layer metal structures 1710_3, 1720_3 and 1730_3 at the surface of the third layer 102_3 of the laser-activatable mold compound 102. Reference is made to the corresponding description above in order to avoid reiteration.

Figure 17J:
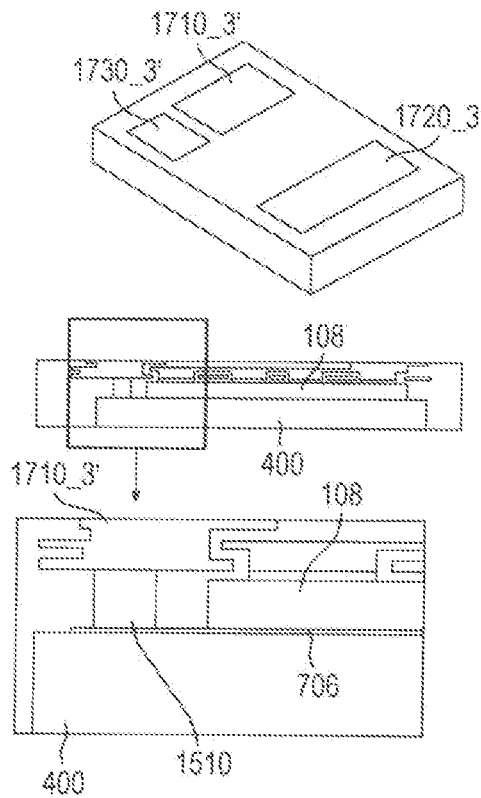

Then, as shown in FIG. 17J, another (e.g. fifth) LDS and plating process may be applied to reshape the third layer metal structures 1710_3, 1720_3, 1730_3 into reshaped third layer metal structures 1710_3', 1720_3' and 1730_3', respectively.

Differently put, in case of a multiple layer laser-activatable mold compound 102, each layer may be separately molded and processed by LDS and plating. Further, one or more LDS processes and plating processes may be applied to each layer 102_1, 102_2, 102_3 of the laser-activatable mold compound 102. In this example, one LDS and metal plating process is applied to the first layer 102_1, two LDS and plating processes are applied to the second layer 102_2 and two LDS and metal plating processes are applied to the third layer 102_3.

Following steps may include masking and singulation as described earlier in conjunction with FIGS. 15E and 15F, respectively.

Figure 18:
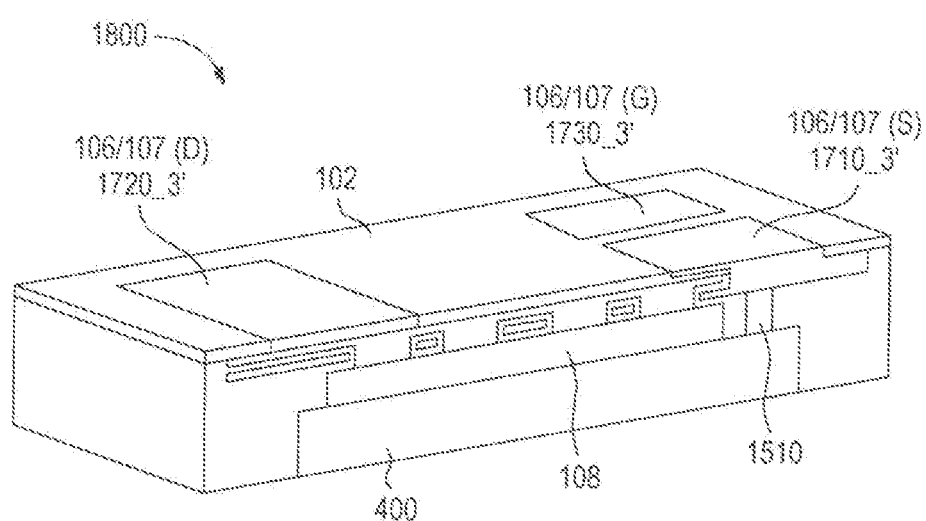
FIG. 18 is a perspective cross-sectional view of a molded package as manufactured by the method exemplified in FIGS. 17A through 17J.

FIG. 18 illustrates a perspective cross-sectional view of a molded multiple layer package 1800 as manufactured by, e.g., the method exemplified in FIGS. 17A through 17J. From FIG. 18 it is apparent that the first layer and second layer and third layer metal structures provide for plated electrical redistribution layers offering a high flexibility to convert the die pad 110 pattern of the semiconductor die 108 into a desired pattern of metal pads 106 and/or metal traces 107 at the surface of the mold compound 102.

That is, the interconnect design can easily be changed through layer molding, LDS and plating processes, and this flexibility includes both the modification of the electrical redistribution layer and any redesign of the I/O footprint layout (e.g. the redesign of the metal pads 106 and/or metal traces 107 which represent the external terminal pads of the molded package 1800). Further, a stress-free interconnect is created, since the interconnect is formed by (e.g. galvanic) plating on a plateable mold compound. It is further to be noted that the formation of the electrical redistribution layer by LDS and plating is a mask-free process, i.e. avoids the necessity of using masks for structuring the interconnect.

Figure 19:
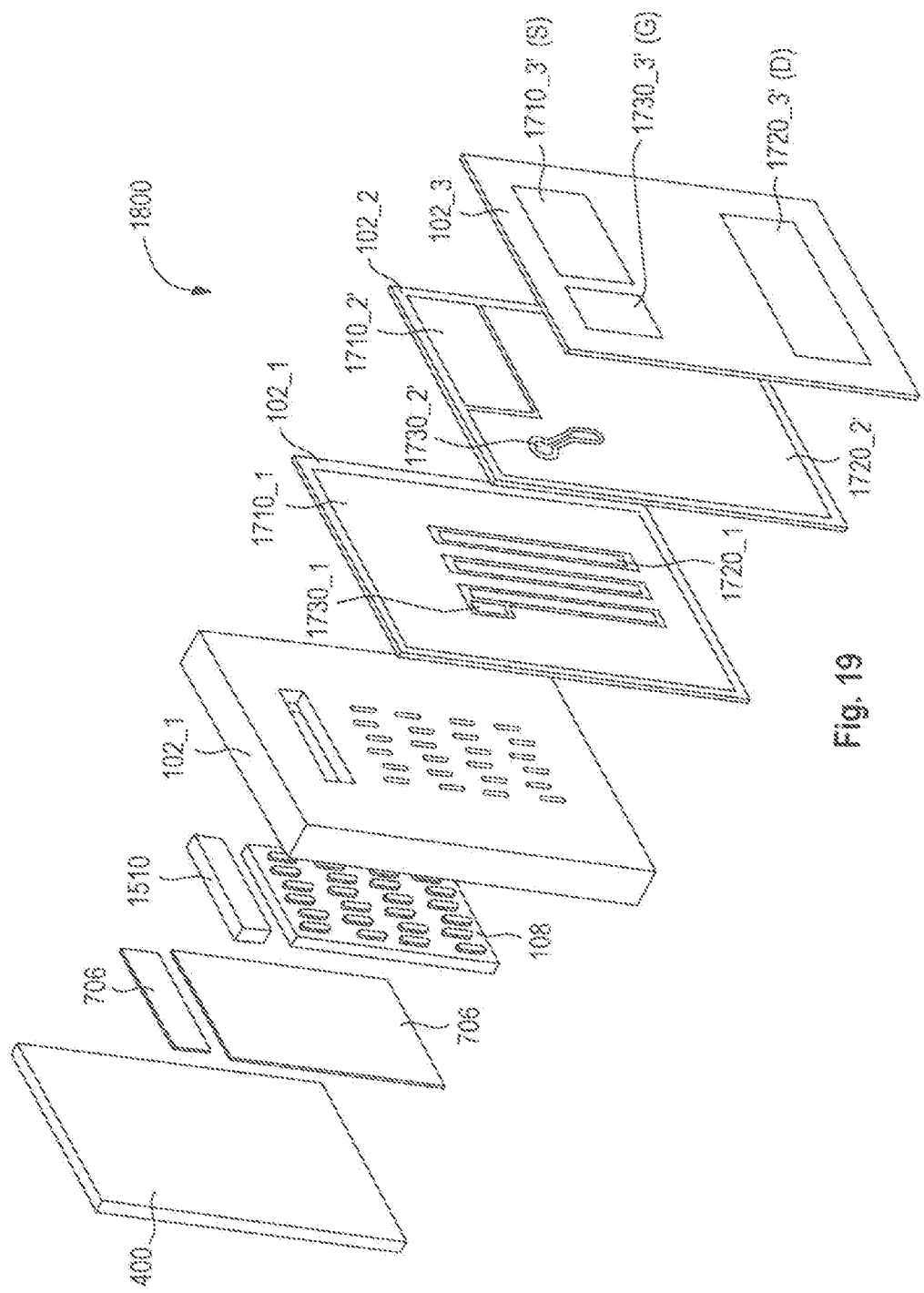
FIG. 19 is an exploded view of the molded package shown in FIG. 18.

FIG. 19 is an exploded view of the molded package 1800 shown in FIG. 18. In this example the source (S) metal pad 106 is realized by third layer metal structure 1710_3', the drain (D) metal pad 106 is realized by third layer metal structure 1720_3' and the gate (G) metal pad 106 is realized by third layer metal structure 1730_3'.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

The invention claimed is:

1. A molded package, comprising:
a laser-activatable mold compound having a plurality of laser-activated regions which are plated with an electrically conductive material to form metal pads and/or metal traces at a first side of the laser-activatable mold compound;
a semiconductor die embedded in the laser-activatable mold compound and having a plurality of die pads; and
an interconnect electrically connecting the plurality of die pads of the semiconductor die to the metal pads and/or metal traces at the first side of the laser-activatable mold compound,
wherein the laser-activatable mold compound is a multiple layer mold compound,
wherein the interconnect comprises a plurality of wire stud bumps or metal pillars or vertical bond wires attached at a first end to the plurality of die pads of the semiconductor die and attached at a second end opposite the first end to first layer metal structures of a first layer of the laser-activatable mold compound,
wherein the first layer of the laser-activatable mold compound has a plurality of laser-activated regions which are plated with an electrically conductive material to form the first layer metal structures.

2. The molded package of claim 1, wherein a second layer of the laser-activatable mold compound has a plurality of laser-activated regions which are plated with an electrically conductive material to form second layer metal structures of the second layer of the laser-activatable mold compound, and wherein the first layer metal structures of the first layer of the laser-activatable mold compound are electrically connected to the second layer metal structures of the second layer of the laser-activatable mold compound.

3. The molded package of claim 1, wherein the plurality of die pads is disposed at a first side of the semiconductor die, wherein a second side of the semiconductor die opposite the first side is not covered by the laser-activatable mold compound, and wherein the molded package further comprises either a glob top covering the second side of the semiconductor die or a heat sink metal plate covering the second side of the semiconductor die.

4. The molded package of claim 1, wherein the semiconductor die comprises a power transistor, an RF front end circuit, logic devices, or is a controller.

5. The molded package of claim 1, wherein a first one of the metal pads at the first side of the laser-activatable mold compound is electrically connected to a first one of the die pads of the semiconductor die by the interconnect, and wherein in a vertical projection of a footprint of the first die pad onto the first side of the laser-activatable mold compound, the first metal pad is positioned outside the footprint of the first die pad.

6. The molded package of claim 5, wherein the first metal pad is connected to a first one of the metal traces at the first side of the laser-activatable mold compound, and wherein in the vertical projection, the first metal trace is positioned inside the footprint of the first die pad and vertically aligned with the first die pad.

7. A method of manufacturing a molded package, the method comprising:
placing a semiconductor die on a carrier, the semiconductor die having a plurality of die pads facing away from the carrier;
attaching at least an initial part of an interconnect to the plurality of die pads of the semiconductor die before or after placing the semiconductor die on the carrier;
embedding the semiconductor die and the interconnect in a laser-activatable mold compound;
directing a laser at a first side of the laser-activatable mold compound to laser-activate a plurality of regions of the laser-activatable mold compound; and
plating an electrically conductive material on the plurality of laser-activated regions of the laser-activatable mold compound to form metal pads and/or metal traces at the first side of the laser-activatable mold compound, wherein the interconnect electrically connects the plurality of die pads of the semiconductor die to the metal pads and/or metal traces at the first side of the laser-activatable mold compound, wherein embedding the semiconductor die and the interconnect in the laser-activatable mold compound comprises thinning the laser-activatable mold compound or drilling holes in the laser-activatable mold compound to expose the at least initial part of the interconnect at the side facing away from the carrier, wherein the laser-activatable mold compound comprises a first layer and a second layer, wherein thinning or drilling holes is applied to the first layer of the laser-activatable mold compound.

8. The method of claim 7, wherein embedding the semiconductor die and the interconnect in a laser-activatable mold compound comprises:

embedding the semiconductor die and the initial part of the interconnect in the first layer of the laser-activatable mold compound;

directing a laser at the first layer of the laser-activatable mold compound to laser-activate a plurality of regions of the first layer of the laser-activatable mold compound;

plating an electrically conductive material on the plurality of laser-activated regions of the first layer of the laser-activatable mold compound to form first layer metal structures at a surface of the first layer of the laser-activatable mold compound; and applying the second layer of the laser-activatable mold compound over the surface of the first layer of the laser-activatable mold compound.

9. The method of claim 8, wherein attaching at least the initial part of the interconnect to the plurality of die pads of the semiconductor die comprises attaching a plurality of wire stud bumps or pillars or vertical bond wires to the plurality of die pads of the semiconductor die.

10. The method of claim 7, wherein the at least initial part of the interconnect protrudes from the first layer of the laser-activatable mold compound at a side facing away from the carrier.

11. A method of manufacturing a molded package, the method comprising:

placing a semiconductor die on a carrier, the semiconductor die having a plurality of die pads facing away from the carrier;

attaching at least an initial part of an interconnect to the plurality of die pads of the semiconductor die before or after placing the semiconductor die on the carrier;

embedding the semiconductor die and the interconnect in a laser-activatable mold compound;

directing a laser at a first side of the laser-activatable mold compound to laser-activate a plurality of regions of the laser-activatable mold compound; and plating an electrically conductive material on the plurality of laser-activated regions of the laser-activatable mold compound to form metal pads and/or metal traces at the first side of the laser-activatable mold compound, wherein the interconnect electrically connects the plurality of die pads of the semiconductor die to the metal pads and/or metal traces at the first side of the laser-activatable mold compound, wherein the at least initial part of the interconnect protrudes from the laser-activatable mold compound or, if the laser-activatable mold compound comprises a first layer and a second layer, from the first layer of the laser-activatable mold compound at a side facing away from the carrier.

12. The method of claim 11, wherein embedding the semiconductor die and the interconnect in a laser-activatable mold compound comprises:

embedding the semiconductor die and the initial part of the interconnect in a first layer of the laser-activatable mold compound;

directing a laser at the first layer of the laser-activatable mold compound to laser-activate a plurality of regions of the first layer of the laser-activatable mold compound;

plating an electrically conductive material on the plurality of laser-activated regions of the first layer of the laser-activatable mold compound to form first layer metal structures at a surface of the first layer of the laser-activatable mold compound; and applying a second layer of the laser-activatable mold compound over the surface of the first layer of the laser-activatable mold compound.

13. The method of claim 12, wherein attaching at least the initial part of the interconnect to the plurality of die pads of the semiconductor die comprises attaching a plurality of wire stud bumps or pillars or vertical bond wires to the plurality of die pads of the semiconductor die.

* * * * *